United States Patent [19]

Kappeler

[11] Patent Number: 4,620,307
[45] Date of Patent: Oct. 28, 1986

[54] SEMICONDUCTOR DIODE LASER

[75] Inventor: Franz Kappeler, Puchheim, Fed. Rep. of Germany

[73] Assignee: Siemens Aktiengesellschaft, Berlin & Munich, Fed. Rep. of Germany

[21] Appl. No.: 688,379

[22] Filed: Jan. 2, 1985

[30] Foreign Application Priority Data

Jan. 13, 1984 [DE] Fed. Rep. of Germany ....... 3401102
Aug. 24, 1984 [DE] Fed. Rep. of Germany ....... 3431228
Feb. 5, 1985 [EP] European Pat. App. ......... 841/3494

[51] Int. Cl.$^4$ .............................................. H01S 3/19
[52] U.S. Cl. ...................................... 372/50; 372/20; 372/97
[58] Field of Search ....................... 372/50, 20, 92, 97, 372/44, 45, 46

[56] References Cited

U.S. PATENT DOCUMENTS

| 4,101,845 | 7/1978 | Russer ............................ 331/94.5 M |
| 4,277,762 | 7/1981 | Scifres et al. ................... 331/94.5 H |
| 4,347,612 | 8/1982 | Fekete et al. ......................... 372/50 |
| 4,488,307 | 12/1984 | Garmire et al. ...................... 372/50 |

OTHER PUBLICATIONS

Appl. Phys. Lett. 41(2), Jul. 15, 1982, "Semiconductor Interferometric Laser", by Fattah et al., pp. 112–114.
IEEE Journal of Quantum Electronics, vol. Q#-18, No. 10, Oct. 1982, "Etched Mirror and Groove-Coupled GaInASP/InP Laser Devices for Integrated Optics", by Goldren et al., pp. 1679–1688.
Appl. Phys. Lett. 43(6), Sep. 15, 1983, "Electronic Wavelength Tuning with Semiconductor Integrated Etalon Interference Lasers", by Arsam Antreasyan et al., pp. 530–532.
Electronics Letters, Oct. 27 1983, vol. 19, No. 22, "Electrical Tuning of Semiconductor Interferometric Laser", pp. 926 and 927.
Appl. Phys. Lett. 43 (6), Sep. 15, 1983, "Phase-Locked Semiconductor Laser Array with Separate Contacts", by J. Katz et al., pp. 521–523.
"A Tunable, Single-Frequency Semiconductor Laser: The Cleaved-Coupled-Cavity Laser and its Device Characteristics", by W. T. Tsang, et al., Bell Laboratories, pp. 24 and 25.

Primary Examiner—James W. Davie
Attorney, Agent, or Firm—Hill, Van Santen, Steadman & Simpson

[57] ABSTRACT

A semiconductor diode laser for tunable single-frequency laser radiation has a plurality of laser-active strips associated with a semiconductor body having first and second reflective end surfaces. The first end surface has laser radiation emitted and coupled out therefrom. One of the strips is an emitting laser-active strip which emits the laser radiation and the further laser-active strips are provided at both sides of the emitting strip. The further strips are shorter than the emitting strip and are provided such that respective resonators corresponding to each strip are provided with mirrors or reflectors at both ends thereof. A first end of the strips terminates in front of the first end face of the semiconductor body.

13 Claims, 5 Drawing Figures

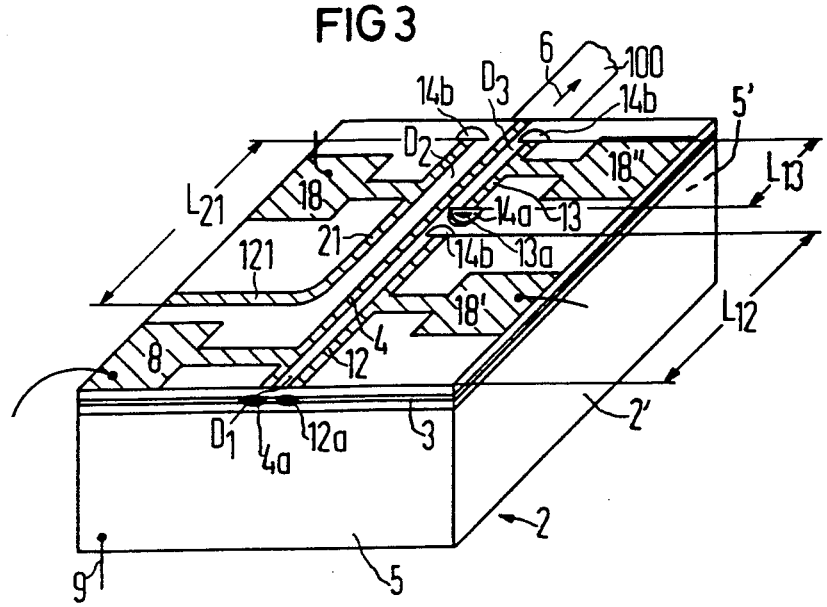
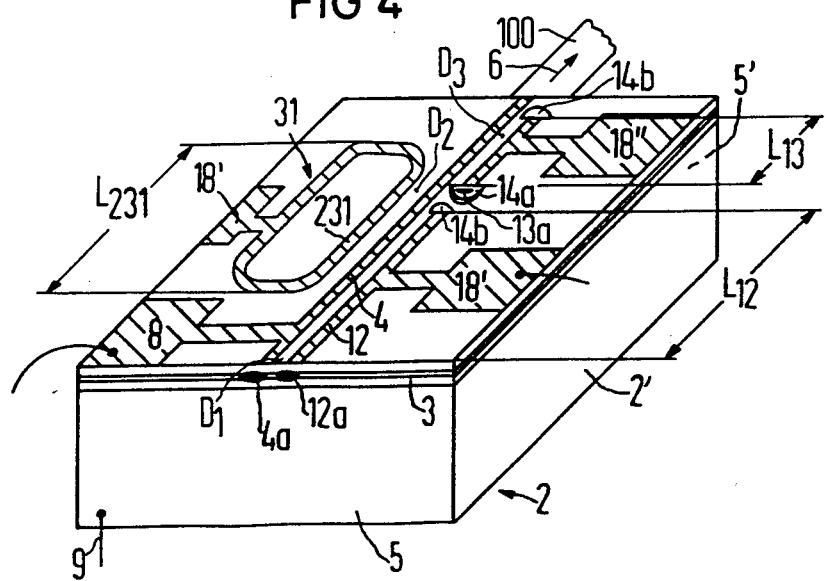

SEMICONDUCTOR DIODE LASER

BACKGROUND OF THE INVENTION

The present invention relates to a semiconductor diode laser for portable single-frequency laser radiation wherein a plurality of laser-active strips with associated optical resonators are provided in a semiconductor body.

Single-frequency semiconductor diode lasers are known from the prior art whose radiation remains single-frequency in nature, even given high frequency modulation of the operating current. The structure of such a semiconductor diode laser is characterized in that a plurality of laser-active strips are provided in the respective semiconductor body lying parallel and adjacent one another or linearly behind one another in a layer plane, said laser-active strips being more or less excited, and even modulated under given conditions, relative to the threshold of the excitation for the respective laser-active strip or its optical resonator.

Details regarding such a diode laser are stated in IEEE Spectrum, December, 1983, pages 38–45, incorporated herein by reference. Numerous possibilities for realizing such diode lasers are shown therein, particularly in the figure of page 43. More far-reaching details are disclosed in the publications cited below:

U.S. Pat. No. 4,101,845 (Russer);
4th Intern. Conf. on Integrated Optics and Optical Fibre Comm., 27–30, June 1983, Tokyo, pages 24 and 25 and page 30/31;
Appl. Phys. Letters, Vol. 43 (1983), pages 530–532 and pages 421–423;
Electronic Letters, Vol. 19 (1983), No. 22, pages 926–927;
Appl. Phys. Letters, Vol. 41 (1982), pages 112–114;
IEEE Journ. of Quantum Electronics, Vol. QE 18 (1982), pages 1679–1687; and
U.S. Pat. Nos. 4,277,762 and 4,347,612.

All of the above publications are incorporated herein by reference.

In order to achieve single-frequency laser radiation, the diode lasers disclosed in these publications have such a structure that the laser radiation traverses more than one resonator along its propagation direction. Such embodiments are based on a physical principle that was already known in the early 1960's, particularly for gas lasers. As a result of their interaction, these several optical resonators disposed following one another (Fabry-Perot resonators) have the generated laser radiation at only a single frequency, at least from a practical standpoint. Normally a laser generates laser radiation that comprises a multi-mode spectrum and numerous, even though adjacently disposed, frequencies of the radiation. The laser radiation passing through a serial multiple resonator structure having resonators with a mutually divergent resonant frequency spectrum experiences its frequency selection for a coinciding natural or resonant frequency of the participating resonators.

The cited publication "Fourth Intern. Conf. . . . " shows a semiconductor diode laser in FIG. 1 as indicated above which essentially comprises two semiconductor bodies adjacent to one another at a slight distance which are situated on a heat sink. Active strips are fashioned in the two semiconductor bodies for generating the laser radiation, said active strips residing opposite one another at their end faces and sharing an optical axis. Radiation from the one active strip proceeds into the other active strip and vice versa. In the normal case, the semiconductor bodies have mutually different length dimensions L1, L2 in the direction of this optical axis, these likewise being the length dimensions of the optical resonators formed by the active strips. Let it also be pointed out that the respective width dimension of the individual strips also defines the optically effective resonator length.

FIGS. 12 and 13 of U.S. Pat. No. 4,101,845 shows an embodiment having laser-active strips aligned parallel and side-by-side, their spacing from one another being selected such that an optical coupling in accordance with FIG. 14 results.

A modulation of emitted pure-mode laser radiation can be effected by a modulation of the electrical current to be supplied to the one active strip.

The actually effective optical length of the respective optical resonator containing the corresponding active strip can be varied or tuned, under given conditions, by a controllable dimensioning of the supplied current, so that, overall, a shift of the frequency position of the single-frequency laser radiation generated is also possible (see FIG. 2 in "4th Intern. Conf. . . . ").

As may be seen, it is necessary that the laser-active strips be aligned with extraordinary precision relative to one another in the one or more semiconductor bodies.

SUMMARY OF THE INVENTION

An object of the present invention is to specify such a monomode or single-frequency semiconductor diode laser that can be manufactured in a technologically simple way, and which particularly requires no special adjustment costs, and which nonetheless has the mechanical and optical stability required for operation, i.e. both high frequency selection as well as good dynamic frequency stability. In particular, the expense arising in conjunction with maskings given the production of the strip-like conductive coatings should be kept low. In particular, measures are to be undertaken which facilitate the coupling of an optical fiber line to the diode laser. Additional attenuation resulting from the tuning means employed is also to be avoided.

This object is achieved in the single-frequency tunable semiconductor diode of the invention by providing additional laser-active strips at both sides of an emitting laser-active strip. The additional strips are shorter than the emitting laser-active strip and the additional laser-active strips are provided in the semiconductor body in such fashion that each further strip is provided with mirrors at both ends and a first end terminates a distance in front of a first end face of the semiconductor body through which the laser radiation to be emitted is coupled out.

Proceeding from U.S. Pat. No. 4,101,845, the present invention is based on the perception that significant advantages can be achieved when a further strip-shaped laser-active strip with its optical resonator is allocated to the strip-like active strip with its optical resonator (Fabry-Perot resonator) situated in the semiconductor body and provided for the emission of the laser radiation. At least one further such strip is allocated thereto in this same semiconductor body in parallel proximity. This occurs in such fashion as shall be explained in greater detail. The presence of a lateral optical coupling between these two adjacent optical resonators is also provided with the invention. The coupling is based on the adjacent arrangement of the two strips or optical resonators transversely relative to the optical axis, the degree of the coupling can be defined by their distance from one another, and the dimension of the length of the coupling sections over which this coupling is effective. Let it be pointed out that it is sufficient and even advantageous under given conditions, when only one part of the resonator length of the allocated optical resonator is subject to these conditions of optical coupling (FIGS. 3 or 4).

An advantage of adjacently disposed laser strips which has been perceived with the invention is that no elements which could effect an additional attenuation are present in the propagation direction of the laser radiation of the individual active strips in the diode laser. This is particularly expressed in a better frequency stability of a mode of the laser radiation. However, it was also perceived in conjunction with the invention that, given lateral coupling, (transversely relative to the optical axis) secondary oscillations or side modes disadvantageously occur to a considerable degree and, as a further disadvantage, the single-frequency laser oscillation of the one active strip is not insensitive to light reflected back which, for example, is reflected back into the other of the neighboring strips from lenses or light waveguides.

The above description refers to the presence of two optical resonators (optically coupled to one another), namely the active strip emitting the laser radiation and the allocated active strip. In accordance with the invention, one or a plurality of optical resonators or active strips is to be allocated to the one optical resonator of the active strip emitting the laser radiation, and is allocated to the latter on both sides. This latter optical resonator can also be flanked on one or on both sides by (respectively) two or more optical resonators respectively disposed in series behind one another in a longitudinal direction (FIGS. 1, 3, 4). It can also be flanked by a plurality of optical resonators disposed next to one another at one side (FIG. 5). Preferably the several optical resonators (of the further, allocated active strips) allocated to the optical resonator of the active strip emitting the radiation are to be set in terms of optical length such that the spacings of the natural resonant frequencies in their respective spectrum differ from one another and also differ from the spacings of the natural resonant frequencies in the spectrum of the optical resonator of the active strip emitting the laser radiation.

An essential feature of the invention is that the further laser-active strips which belong to the further strip-like coatings do not extend at their respective one end up to the end face (the back end face 5' in the Figure) adjacent to them which is reserved for the emission of the laser radiation. Also, the entire end face 5' is also available for the coupling of a fiber line.

A significant advantage of this arrangement given the invention is that a very high suppression of undesired secondary frequencies of the laser radiation is achieved by the respectively shorter resonator length of the further laser-active strips. A further significant advantage is that the fluctuation of the laser frequency occurring given traditional laser structures under the influence of a high-frequency modulation current is considerably reduced as a result of coupling a plurality of laser resonators perpendicular to the optical axis. This is achieved since only the laser strip 4, 4a provided for the emission of laser radiation is modulated with a high-frequency current component, whereas the allocated, further laser resonators are only statically operated and thus exert a frequency-stabilizing effect on the modulated laser strip.

BRIEF DESCRIPTION OF THE DRAWINGS

FIGS. 2, 3, and 5 show further alternatives; and

FIG. 4 shows a further alternative having an allocated optical resonator of especially high quality.

DESCRIPTION OF THE PREFERRED EMBODIMENTS

Figure 1:
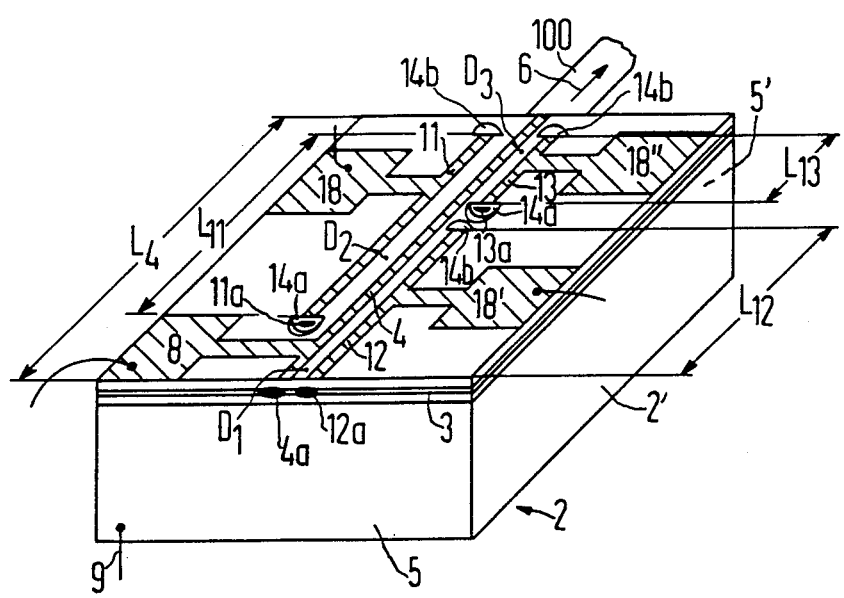
FIG. 1 shows an illustration that embraces a number of alternatives of an embodiment of the invention.

In FIG. 1, 2 references a semiconductor body, for example, gallium arsenide. As is known from heterostructure diode lasers, a number of layers 3 deposited and particularly epitaxially deposited on top of one another, are situated on the one principal face of a substrate 2'. These layers 3 form the semiconductor body 2 of the diode laser together with the substrate 2'. The zone of an emitting laser-active strip 4a lies within one of these layers 3 under a strip-like conductive coating 4 in known fashion. Laser radiation is generated by self-excitation in the emitter strip 4a given current flux, namely when the current density thereat exceeds a certain threshold. A respective optical resonator exists in the semiconductor body, as likewise notoriously known, since first and second end faces 5' and 5 (not visible) lying opposite one another are present at the semiconductor body 2. These end faces, as is known, have a mirroring effect for the generated laser radiation when adjacent to air. However, due to the limited reflective effect of the faces 5', a laser beam referenced 6 emerges through the face 5' from the optical resonator of the one active strip 4a (for example, into the fiber line 100). As is known, multiple reciprocation of the generated laser radiation between the mirroring faces 5, 5' occurs within the optical resonator corresponding thereto.

The electrode coating is present on the upper surface of the uppermost layer 3, i.e. on the surface of the semiconductor body 2 composed of the parts 2' and 3, said electrode coating being emphasized with shading for greater clarity. It is composed of the strip-shaped coating 4 and of a terminal 8 electrically connected thereto via a connecting strip. The topical position of the strip-like conductive coating 4 defines the topical position of the active strip 4a in which the desired laser radiation is generated and emerges as laser radiation 6. The layer 3 in which the laser radiation is generated results from the layer selection. The cooperating electrode to the strip-like electrode coating 4 is the substrate body 2 with its electrical terminal 9.

The above-described details to the illustrative embodiment are known prior art and do not require a more detailed explanation for the person skilled in this art.

As may be seen from the illustration of FIG. 1, at least two further strip-like conductive coatings are provided on the aforementioned surface of the layers 3. The further, strip-like conductive coatings are referenced 11, 12, and 13. Each of these strip-like coatings preferably has a discrete terminal 18, 18', 18" which is electrically connected to the strip-like coating 11, 12, or 13.

Laser radiation can be excited under these conductive coatings 11, 12, or 13 by a respective current flux between the terminals 18 and the cooperating electrode 9, as has already been described in greater detail for the active strip 4a. This occurs when the flowing current is allowed to exceed the respective threshold for self-excited radiation generation. A respective optical resonator is thus effective as is known, between mutually opposite mirroring faces in the same fashion as described in conjunction with the optical resonator of the active strip 4a corresponding to the strip-like conductive coating 4. None of the strip-like conductive coatings 11 through 13 extend at a first end up to the end face 5' of the substrate body where the radiation 6 is emitted. In the direction toward the end face 5', the coatings 11, 12, and 13 end at prescribed locations (trenches 14b), as do the corresponding laser-active strips 11a, 12a, 13a with their corresponding resonators. Trenches 14b generated, for example, by locally limited ion etching and proceeding into the layer system 3 from above, and extending under given conditions further into the substrate body 2', can be provided for this purpose. There is a vertical end face within the layer system 3 in each of the trenches. These "inside" end faces are executed so planarly and smoothly that they at least essentially have the same mirroring effect as exists in the case of the end faces 5, 5'. The analogous case is true for the trenches 14a of the direction facing the end face 5.

According to the invention, the current flux or its current density is kept lower for the further active strips 11a, 12a, 13a under the coatings 11, 12, and 13, for each strip taken individually, than the threshold required for generating the laser radiation. Thus there exists a respective active strip with an optical resonator in which generation of laser radiation—each stripe considered by itself—does not yet occur due to the value of current lying below the laser threshold. Due to the optical coupling to the strip 4a emitting the laser radiation, the further active strips 11a, 12a . . . form a system of synchronized laser oscillators together with the strip 4a. As may particularly be seen from FIG. 1, the coatings 11, 12, 13 on the one hand and the coating 4 on the other hand extend laterally next to one another in an at least essentially parallel alignment. In order to achieve the lateral optical coupling between the active strip 4a emitting the laser radiation and the plurality of proximately disposed active strips 11a, 12a, 13a with optical resonators, the spacings D1, D2, and D3 are dimensioned to a maximum size of about 100, and preferably not more than 50 wavelengths. In particular, they are dimensioned up to about 30 wavelengths of the laser radiation. This specification of wavelength refers to the wavelength respectively occurring in the semiconductor material.

As may be seen from FIG. 1, the respective active strips 11a, 12a, 13a, i.e. the conductive coatings 11, 12, 13 carrying the current, advantageously do not extend along the entire length of the active strip 4a or of the strip-like coating 4. The strip-like conductive coatings 11 and 12 or 13 are provided at both sides of the strip-like conductive coating 4 in order to guarantee that the specifically modulated laser radiation 6 is single-frequency, or the active strip allocated to the coating 6 supplies a single-frequency radiation 6 even in unfavorable or critical operating instances. One alternative is to provide the allocation shown in FIG. 1 which has the two succeeding strip-like conductive coatings 12 and 13 in addition to the further coating 11.

Figure 2:
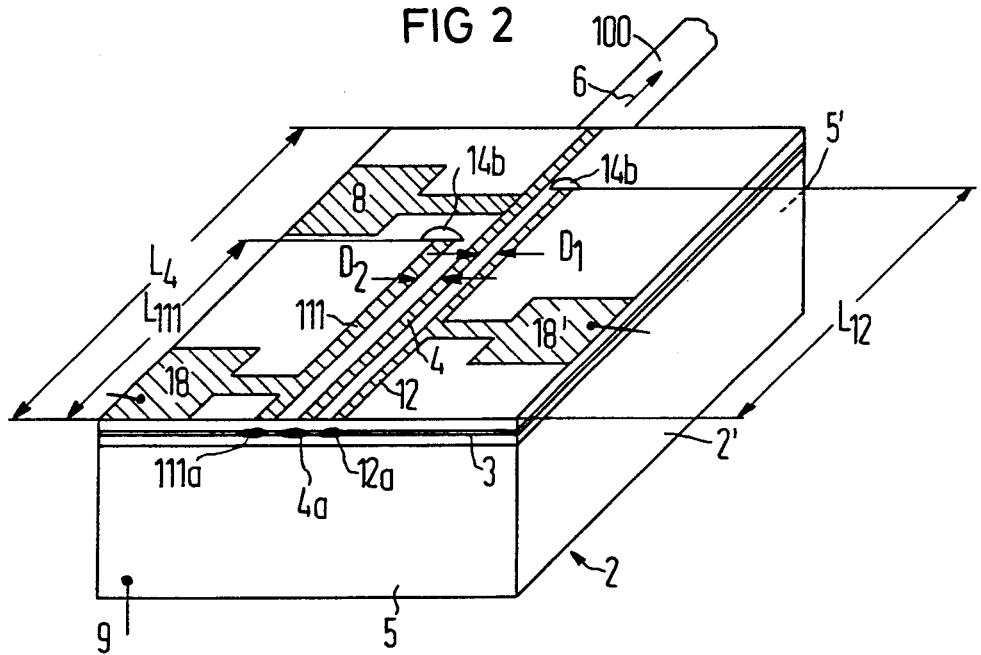

As already initially mentioned, the illustration of FIG. 1 already encompasses three alternatives for specific embodiments of the invention. A modification of the one alternative is shown in FIG. 2 in which the details coinciding with those of FIG. 1 are provided with the same reference characters. The coating 111 corresponds to the coating 11. It is merely differently arranged, having one end of the laser-active strip 111a in the end face 5. The trench 14a of the strip 11 is eliminated here. FIG. 3 shows yet another alternative. The reference characters found in FIG. 3 and already described in FIG. 1 have the same significance in FIG. 3 as in FIG. 1. The strip-like conductive coating 21 in FIG. 3 has a shape as may be seen from the Figure. At one end, after a 90° bend, it proceeds to a lateral edge face of the layers 3 as part 121. This shape or path of the coating 21 (including the part 121) forms an active strip with an optical resonator proceeding thereunder over the same path whose one mirroring end face coincides with the lateral face of the semiconductor body 2. The other mirroring end face of the optical resonator of the active strip corresponding to the coating 21 already ends in the trench 14b in the semiconductor body in accordance with the invention. An embodiment according to FIG. 3 can, for example, be advantageous in the respect that the length of the optical resonator of the active strip corresponding to the coating 21 can have a relatively greater resonator length L21, and thus a higher resonator quality. This can have a positive effect on the stability of generating the single-frequency laser radiation 6. The wave-optical coupling to the strip 4a, however, is restricted to the length L21.

A further alternative of an embodiment according to the invention and, in particular, a development of the embodiment of FIG. 3, is shown in FIG. 4. There the one strip-like coating is a preferably oblong ring 31 whose part 231 meets the condition of extending proximate and essentially parallel to the strip-shaped coating 4 of the active strip generating the radiation 6. The lateral coupling (based essentially on the spacing D2) exists for this part 231. With ring 31 a ring laser is realized which has a particularly high resonator quality.

Figure 5:
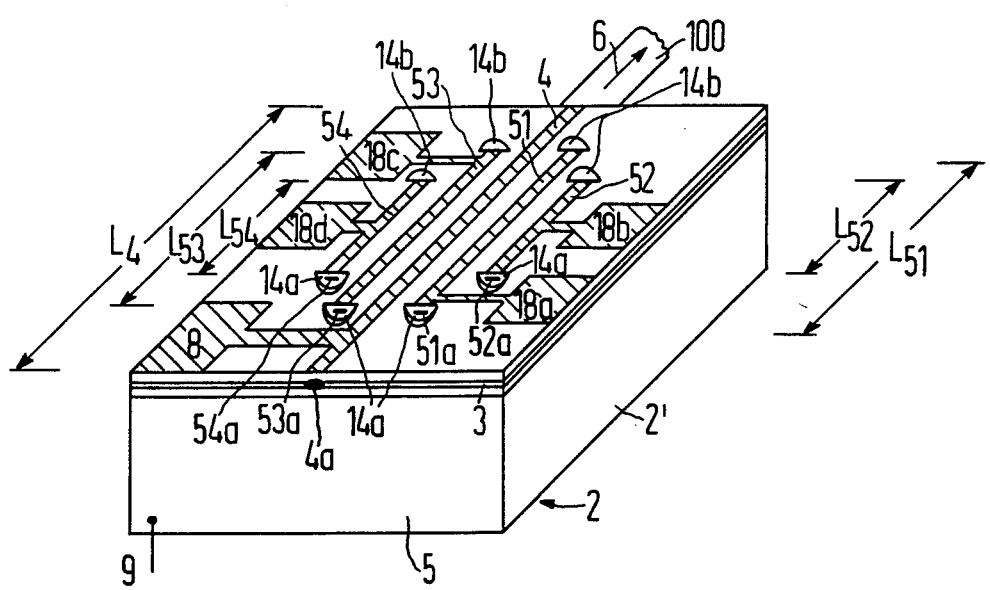

FIG. 5 shows an embodiment wherein a plurality of further laser-active strips with corresponding strip-like coatings are disposed at both sides of the laser-active strip 4a provided for the laser radiation to the output, i.e. at both sides of the strip-like coating 4. These are the strip-like coatings 51 and 52 at the one side and the strip-like coatings 53 and 54 at the other side of the strip-like coating 4. The resonators of these further laser-active strips 51a, 52a, 53a, and 54a correspond to the strip-like coatings 51–54 and have mirror faces at their ends in the trenches 14a and 14b. None of these further laser-active strips extend up to the end face 5' of the semiconductor body 2 at which the optical fiber 100 connects. The corresponding terminals are referenced 18a–18d. As may be seen from FIG. 5, the further laser-active strips 51–54a are, when viewed together, advantageously disposed at least essentially symmetrically relative to the laser-active strip 4a emitting the laser radiation 6. The strips 51, 52 or 53, 54 of one side can be selected to be of different length for connecting the terminals 18a and 18c to the respective strip-like coating 51 or 53 in a technologically simple fashion, among other reasons.

By selecting the current intensities or the current densities in the respective active region, the resonators corresponding to these regions can be tuned to one another such that the single-frequency laser radiation 6 results in the final analysis. This tuning has a certain tuning width. The frequency value of this single-frequency radiation can also be controllably varied within this tuning width by further fine tuning of the current intensities.

The embodiments shown in the Figures have the advantage that only laser radiation of the one laser-active strip under the strip-like coating 4 appears at the back end face 5' of the semiconductor body 2. No mechanical and/or optical problems can occur given the embodiment of this invention due to the relatively larger cross-sectional dimensions of the connected fiber line 100 in comparison to the spacings $D_1$ and $D_2$.

As may be seen, there are no overlaps of the terminals 8, 18, 18' with any of the zones below the strip-like coatings 4, 12, 111 given the illustrated, preferred embodiment. As a result thereof, the electrical contacts can be executed in particularly simple fashion, i.e. without special techniques for mutual insulation.

Although various minor changes and modifications might be proposed by those skilled in the art, it will be understood that I wish to include within the claims of the patent warranted hereon all such changes and modifications as reasonably come within my contribution to the art.

I claim as my invention:

1. A semiconductor diode laser for tunable single-frequency laser radiation, comprising:
    a semiconductor body having first and second end faces, the laser radiation to be emitted being coupled out at the first end face;
    a plurality of laser-active strips on a semiconductor body and having associated respective optical resonators;
    said strips being aligned parallel to one another over an entire coupling length therebetween and at an interval from one another such that lateral wave-optical coupling is provided between neighboring strips;
    a given selected spacing and a given selected coupling length between neighboring strips being chosen so as to provide a given coupling;
    one of said laser-active strips being designated as an emitting laser-active strip generating laser radiation;
    the further laser-active strips being provided at both sides of said emitting laser-active strip and being shorter than said emitting laser-active strips; and
    said further laser-active strips being provided in said semiconductor body such that corresponding resonators of each further strip are provided with mirrors at both ends thereof and a first end of the further laser-active strips terminating a distance in front of said first end face of the semiconductor body through which the laser radiation to be emitted is coupled out.

2. A diode laser according to claim 1 wherein a second end of at least one further laser-active strip terminates at the second end face of the semiconductor body not employed for the emission of the laser radiation.

3. A diode laser according to claim 1 wherein at least one of the further laser-active strips does not extend up to the first and second end faces of the semiconductor body with either of its respective first or second ends.

4. A diode laser according to claim 1 wherein individual lengths of said further laser-active strips are respectively disposed relative to a longitudinal axial extent of the emitting laser-active strip such that lengths of said further laser-active strips extend symmetrically relative to a length of the emitting laser-active strip.

5. A diode laser according to claim 1 wherein spacings of the further laser-active strips from the emitting laser-active strip are of equal size.

6. A diode laser according to claim 1 wherein all further laser-active strips are disposed at least essentially symmetrically relative to a longitudinal axis of the emitting laser-active strip.

7. A diode laser according to claim 1 wherein at least two further laser-active strips are provided to both sides of the emitting laser-active strip.

8. A diode laser according to claim 1 wherein further active strips are disposed lying behind one another and parallel to said emitting active strip at one side thereof.

9. A diode laser according to claim 1 wherein a further active strip is designed as a ring strip.

10. A diode laser according to claim 1 wherein at least one of said further active strips has a portion which deviates in a direction away from said emitting active strip.

11. A diode laser according to claim 1 wherein at least a majority of the individual active strips have their own associated electrical terminal.

12. A diode laser according to claim 1 wherein at least one of said mirrored ends of the optical resonator of at least one of the further active strips is formed by a trench produced in the semiconductor body by ion etching.

13. A semiconductor diode laser for tunable single-frequency laser radiation, comprising:
    a semiconductor body having first and second end faces, the laser radiation to be emitted being coupled out at the first end face;
    at least two laser-active strips on a semiconductor body and having associated respective optical resonators;
    said strips being aligned parallel to one another over at least a substantial portion of a coupling length therebetween and at an interval from one another such that lateral wave-optical coupling is provided between neighboring strips;
    a given selected spacing and a given selected coupling length between neighboring strips being chosen so as to provide a given coupling;
    one of said laser-active strips being designated as an emitting laser-active strip generating laser radiation;
    the further laser-active strip being provided alongside of said emitting laser-active strip; and
    said further laser-active strip being provided in said semiconductor body such that a corresponding resonator of the further strip is provided with a reflector at at least one end thereof, and an end of the further laser-active strip terminating a distance in front of said first end face of the semiconductor body through which the laser radiation to be emitted is coupled out.

* * * * *

UNITED STATES PATENT AND TRADEMARK OFFICE
CERTIFICATE OF CORRECTION

PATENT NO. : 4,620,307
DATED : October 28, 1986
INVENTOR(S) : Franz Kappeler

It is certified that error appears in the above—identified patent and that said Letters Patent is hereby corrected as shown below:

Column 7, line 48, delete "strips", and substitute --strip--.

Signed and Sealed this

Twelfth Day of April, 1988

*Attest:*

DONALD J. QUIGG

*Attesting Officer*     *Commissioner of Patents and Trademarks*